United States Patent
Reaves, III et al.

(10) Patent No.: US 10,822,744 B2
(45) Date of Patent: Nov. 3, 2020

(54) SUCTION ROLL SEAL STRIP MONITOR AND LUBRICATION WATER CONTROL SYSTEM

(71) Applicant: Stowe Woodward Licensco, LLC, Youngsville, NC (US)

(72) Inventors: Samuel Howard Reaves, III, Stephens City, VA (US); Jeffrey Moore, Appleton, WI (US)

(73) Assignee: Stowe Woodward Licensco LLC, Youngsville, NC (US)

( * ) Notice: Subject to any disclaimer, the term of this patent is extended or adjusted under 35 U.S.C. 154(b) by 296 days.

(21) Appl. No.: 15/968,081

(22) Filed: May 1, 2018

(65) Prior Publication Data
US 2018/0313035 A1 Nov. 1, 2018

Related U.S. Application Data

(60) Provisional application No. 62/492,486, filed on May 1, 2017.

(51) Int. Cl.
*D21F 7/00* (2006.01)
*H05K 5/02* (2006.01)
(Continued)

(52) U.S. Cl.
CPC ............ *D21F 7/003* (2013.01); *D21F 3/10* (2013.01); *D21F 5/143* (2013.01); *D21F 5/146* (2013.01);
(Continued)

(58) Field of Classification Search
CPC ... D21F 3/10; D21F 3/105; D21F 1/48; D21F 1/50; D21F 1/52; D21F 1/523; D21F 1/526; D21F 1/74; D21F 1/76
See application file for complete search history.

(56) References Cited

U.S. PATENT DOCUMENTS 2,852,986 A * 9/1958 Western .................... D21F 3/10
162/263
2,877,694 A * 3/1959 Thiessen ................... D21F 3/10
162/369
(Continued)

FOREIGN PATENT DOCUMENTS

WO 2016/040975 A1 3/2016

OTHER PUBLICATIONS

Examination Report corresponding to Australian Application No. 2018261609 dated Dec. 13, 2019.
(Continued)

*Primary Examiner* — Jason L Vaughan
(74) *Attorney, Agent, or Firm* — Myers Bigel, P.A.

(57) ABSTRACT

A suction roll includes: a cylindrical shell having an internal lumen and a plurality of through holes; a suction box positioned in the lumen of the shell; a suction source operatively connected with the suction box; at least one seal strip attached to the suction box and configured to assist in forming a seal between the suction box and the shell; a sensor attached to the seal strip; and a controller operatively connected with the sensor. The sensor is configured to convey signals to the controller, the signals being processed in the controller to provide data on the seal strip on at least one of temperature, wear, vibration, and pressure.

7 Claims, 17 Drawing Sheets

(51) Int. Cl.
  *D21F 5/14*   (2006.01)
  *F16N 29/00*  (2006.01)
  *D21F 3/10*   (2006.01)
  *H05K 5/00*   (2006.01)
  *H05K 1/18*   (2006.01)

(52) U.S. Cl.
  CPC ........... *F16N 29/00* (2013.01); *H05K 5/0247* (2013.01); *H05K 1/189* (2013.01); *H05K 5/0026* (2013.01); *H05K 2201/10151* (2013.01)

(56) References Cited

U.S. PATENT DOCUMENTS

| | | | | |
|---|---|---|---|---|
| 5,523,873 A * | 6/1996 | Bradford, III | .... | G02F 1/133382 349/139 |
| 6,152,597 A * | 11/2000 | Potega | ..... | G01K 1/02 374/185 |
| 6,436,241 B1 * | 8/2002 | Persson | ..... | D21F 3/10 162/272 |
| 6,578,669 B2 * | 6/2003 | Kast | ..... | B61K 3/02 184/3.2 |
| 7,059,769 B1 * | 6/2006 | Potega | ..... | G01R 31/3835 374/185 |
| 7,144,477 B2 * | 12/2006 | Gleason, Jr. | ..... | D21F 3/10 162/198 |
| 8,596,417 B2 * | 12/2013 | Barrett | ..... | F02C 7/06 184/6.11 |
| 9,302,871 B2 * | 4/2016 | Breineder | ..... | D21F 3/06 |
| 9,447,542 B2 * | 9/2016 | Erkelenz | ..... | D21F 1/50 |
| 9,605,761 B2 * | 3/2017 | Schotge | ..... | D21F 3/10 |
| 10,179,973 B2 * | 1/2019 | Keinberger | ..... | D21F 3/10 |
| 10,392,750 B2 * | 8/2019 | Erkelenz | ..... | D21F 3/10 |
| 2001/0003112 A1 | 6/2001 | Kirchner | | |
| 2004/0053758 A1 | 3/2004 | Gustafson | | |
| 2006/0248723 A1 | 11/2006 | Gustafson | | |
| 2007/0100253 A1 * | 5/2007 | Sisk | ..... | G01K 1/14 600/549 |
| 2007/0137936 A1 * | 6/2007 | Akechi | ..... | G01P 13/0033 184/14 |
| 2009/0198275 A1 * | 8/2009 | Godown | ..... | A61J 17/003 606/236 |
| 2016/0076200 A1 | 3/2016 | Gustafson et al. | | |
| 2017/0059042 A1 * | 3/2017 | Withers | ..... | D21F 3/10 |

OTHER PUBLICATIONS

International Preliminary Report on Patentability corresponding to International Application No. PCT/US2018/030187 dated Nov. 14, 2019.

Notification of Transmittal of the International Search Report and the Written Opinion of the International Searching Authority, or the Declaration corresponding to International Application No. PCT/US2018/030187 dated Aug. 10, 2018.

* cited by examiner

{PRIOR ART}

{PRIOR ART}

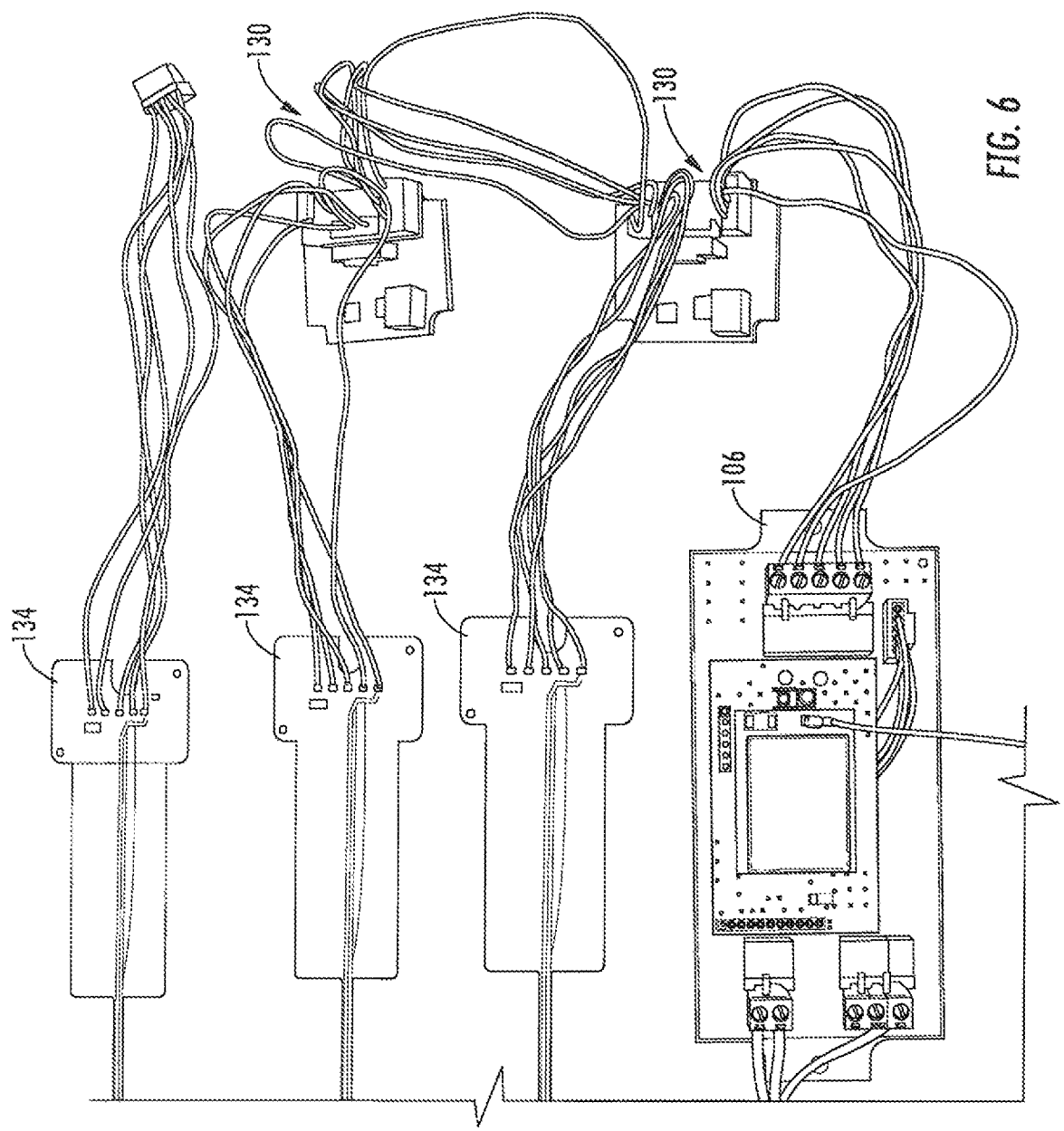

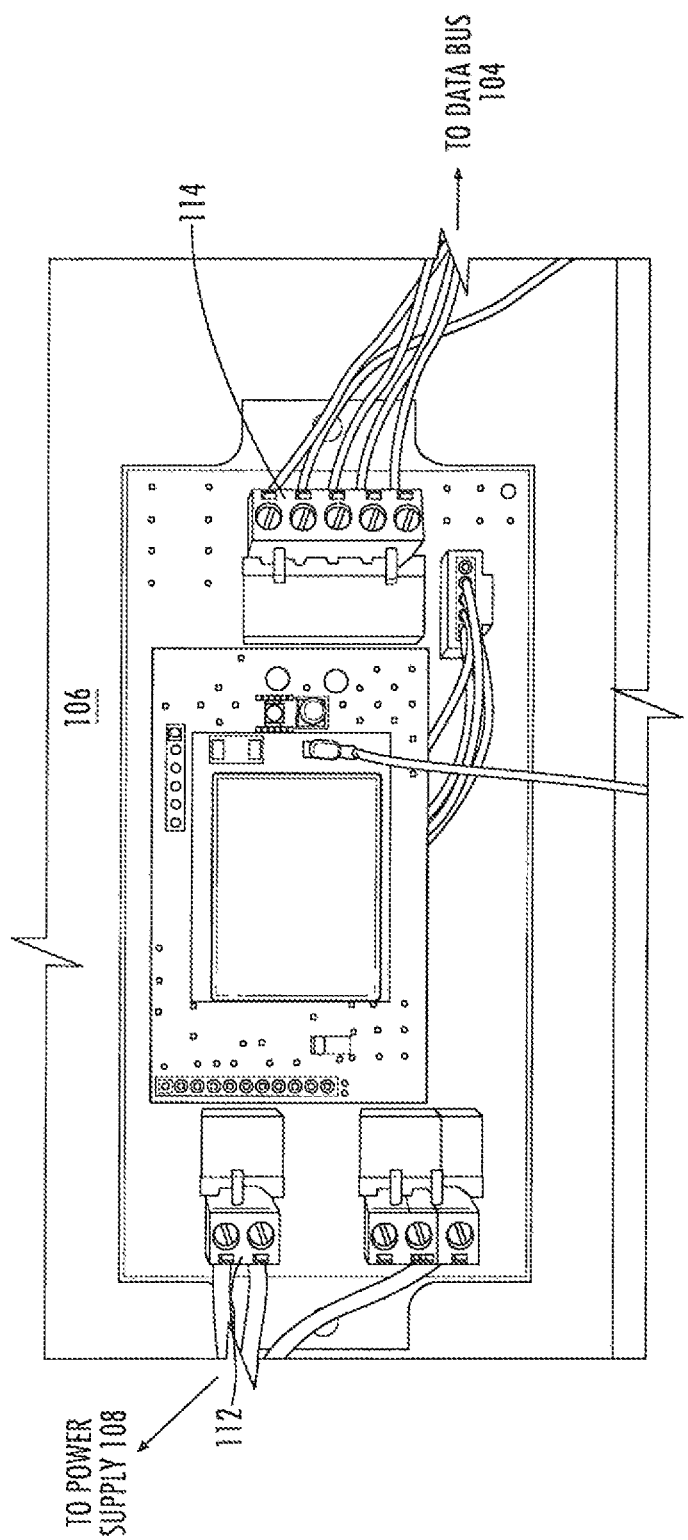

SUCTION ROLL SEAL STRIP MONITOR AND LUBRICATION WATER CONTROL SYSTEM

RELATED APPLICATION

This application claims priority from and the benefit of U.S. Provisional Patent Application No. 62/492,486, filed May 1, 2017, the disclosure of which is hereby incorporated herein in its entirety.

BACKGROUND

Paper manufacturing inherently requires at many points in the production process the removal of water. In general the paper pulp (slurry of water and wood and other fibers) rides on tap of a felt (in the form of a wide belt) which acts as a carrier for the wet, pulp before the actual sheet of paper is formed. Felts are used to carry the pulp in the wet section of the paper machine until enough moisture has been removed from the pulp to allow the paper sheet to be processed without the added support added by the felt.

Quite commonly on the wet end of a paper machine the first water removal is accomplished using a suction roll in a press section (be it a couch, pickup, or press suction roll) used in conjunction with a standard press roll without holes (or against a Yankee dryer in a tissue machine) that mates in alignment with the suction roll. The felt pulp carrier is pressed between these two rolls.

The main component of a suction roll includes a hollow shell 12 (FIG. 1) made of stainless steel, bronze or other metal that has tens of thousands of holes, drilled in a prescribed pattern radially around the circumference of the roll. These holes are gauged in size (ranging from under ⅛" to nearly ¼") and are engineered for the particular paper material to be processed. It is these holes that form the "venting" for water removal. This venting can typically range from approximately 20 to 45 percent of the active roll surface area. The suction roll shell is driven by a drive system that rotates the shell around a stationary core called a suction box.

The suction box 20 (FIG. 2) can be thought of as conventional long rectangular box without a lid on the top and with ports on the end, bottom or sides. The end (specifically the drive end) of the box typically has a pilot bearing of which the inner raceway is a pilot bushing or bearing with a slip fit to a journal on the suction box and the outer raceway is pressed onto the rotating shell. An exemplary suction box and shell are shown in U.S. Pat. No. 6,358,370 to Huttunen, the disclosure of which is hereby incorporated herein in its entirety.

In order to take advantage of the holes in the shell a vacuum zone 30 must be created using these ports on the inside of the suction roll shell in a zone that is directly underneath the paper pulp that is being processed. This is accomplished by the suction box 20 using a slotted holder 32 which holds a seal along the long axis of the suction box on both sides. FIG. 2 shows the slotted holders 32, and FIGS. 3 and 4 show two varieties of seals 34, 34'. In addition to these long seals there are two shorter seals (called end deckles) on the short ends (called tending and drive ends) that have some axial adjustment as needed to accommodate various sheet widths.

The seals 34, 34' are usually made of rubberized polymerized graphite and are held nearly in contact with the inner surface of the shell 12 during operation (see FIGS. 3 and 4). Between the seals 34, 34' a constant vacuum is drawn. This allows the vacuum zone 30 to be created underneath the sheet 40 as is passes over the roll 10.

In actual application, in a properly functioning, suction roll the seals 34, 34' never directly contact the inside of the suction roll shell 12. If the seals 34, 34' do contact the shell 12 they would wear away and would quickly lose their sealing ability. In order to eliminate or significantly reduce this wear and to provide a seal, water is applied along the length of the seal 34, 34' with a lubrication shower formed with water flowing through a spray nozzle 24 (see FIG. 2). This shower keeps the seals 34, 34' lubricated with a laminar flow of water between the seal surface and the inside surface of the shell 12.

The amount of water used for lubrication should be gauged properly so that the proper amount of lubrication is applied to keep the seals 34, 34' lubricated, but not so much to either become an issue for the pulp being processed or to be wasting water. In addition, process water used in a paper mill may contain chemicals and also significant particulates that may clog the lubrication shower nozzles 24 during normal operation. Since these nozzles 24 are located inside the rotating shell 12 they are not visible to the paper machine operator.

SUMMARY

As a first aspect, embodiments of the invention are directed to a suction roll, comprising: a cylindrical shell having an internal lumen and a plurality of through holes; a suction box positioned in the lumen of the shell; a suction source operatively connected with the suction box; at least one seal strip attached to the suction box and configured to assist in forming a seal between the suction box and the shell; a sensor attached to the seal strip; and a controller operatively connected with the sensor. The sensor is configured to convey signals to the controller, the signals being processed in the controller to provide data on the seal strip on at least one of temperature, wear, vibration, and pressure.

As a second aspect, embodiments of the invention are directed to a suction roll, comprising: a cylindrical shell having an internal lumen and a plurality of through holes; a suction box positioned in the lumen of the shell; a suction source operatively connected with the suction box; at least one seal strip attached to the suction box and configured to assist in forming a seal between the suction box and the shell; first, second and third sensors attached to the seal strip; and a controller operatively connected with the sensors. The sensors are configured to convey signals to the controller, the signals being processed in the controller to provide data on the seal strip on at least one of temperature, wear, vibration, and pressure.

As a third aspect embodiments of the invention are directed to a suction roll, comprising: a cylindrical shell having an internal lumen and a plurality of through holes; a suction box positioned in the lumen of the shell; a suction source operatively connected with the suction box; at least one seal strip attached to the suction box and configured to assist in forming a seal between the suction box and the shell; first, second and third sensors attached to the seal strip, the sensors being mounted on a flexible circuit board; and a controller operatively connected with the sensors. The sensors are configured to convey signals to the controller, the signals being processed in the controller to provide data on the seal strip on at least one of temperature, wear, vibration, and pressure.

BRIEF DESCRIPTION OF THE FIGURES

FIG. 6 is a schematic view of a Tending End Controller and seal strip sensing units of the system of FIG. 5.

FIG. 7A is a top view of the Tending End Controller of FIG. 6.

DETAILED DESCRIPTION

Figure 1:
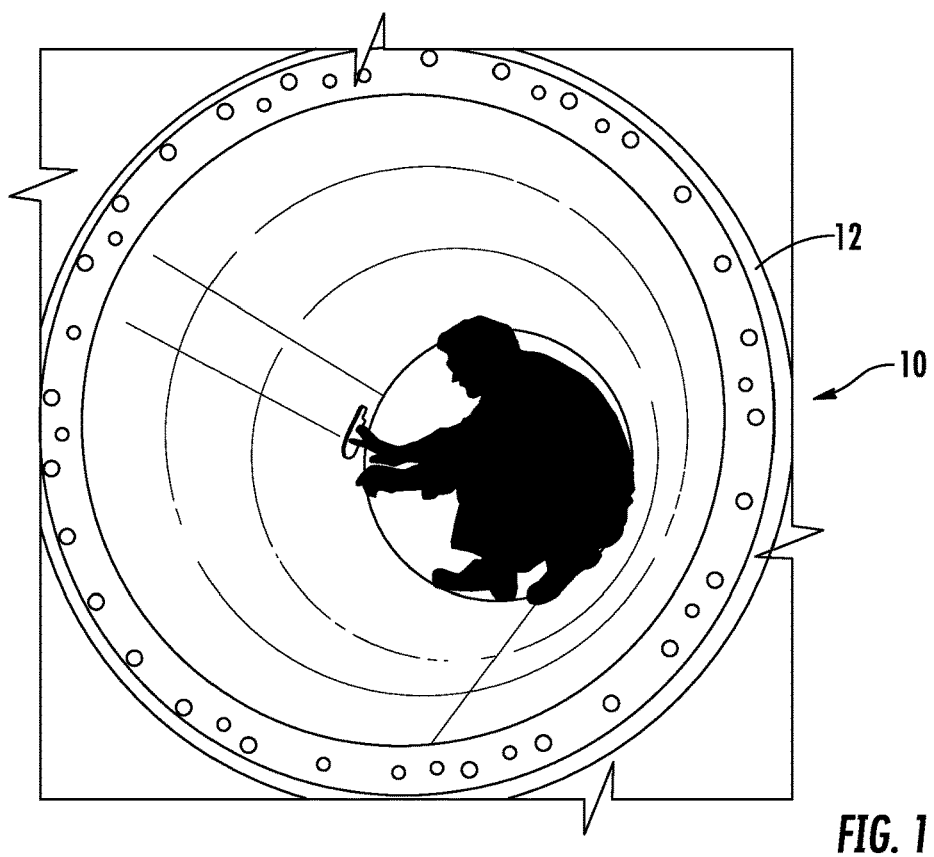
FIG. 1 is a perspective end view of a typical paper machine suction roll.
Figure 2:
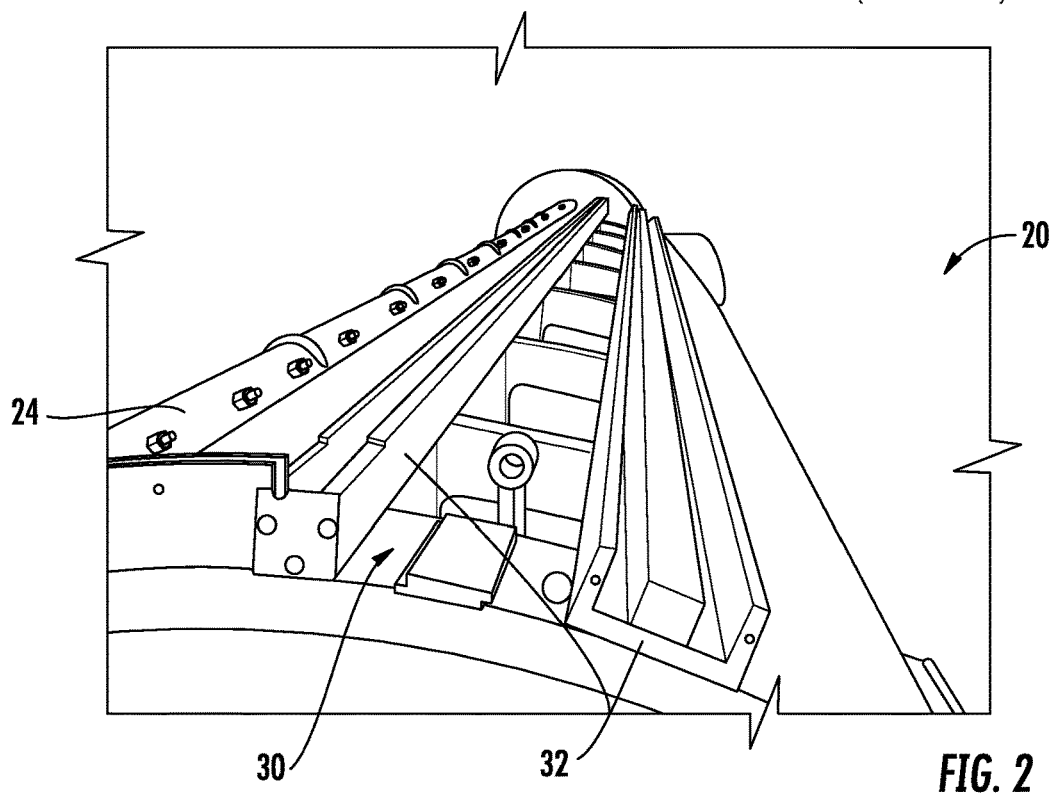
FIG. 2 is an enlarged perspective end view of the suction box area of a typical suction roll.

The present invention will now be described more fully hereinafter, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. Thicknesses and dimensions of some components may be exaggerated for clarity.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

Overview of the System:

Features of the described system can provide methods to measure strip temperature, strip wear and a method to purge dogged lubrication shower nozzles with an electronic multi-microprocessor based measurement and control system. It may also provide optional features to gauge the strip movement (closer or farther from the shell) and also pilot bearing temperature and vibration. Each of these modules may contain microprocessors, each under programmed firmware control.

The system 100 (FIG. 5) includes a computer (such as the host PC 102 described herein) that presents a graphic display of at least some of the following items:

The seal strips and the zones monitored

The temperature and wear status of each monitored zone

Nominal percentage of water flow based on control valve opening if present the status of the auto-valve purge system Vibration and temperature status of the pilot bearing Relative position of the seal strip sealing surface strip to the inner shell surface given by the seal position sensor Any warning levels, or system faults (temperature/wear, valve faults, etc.)

Figure 5:
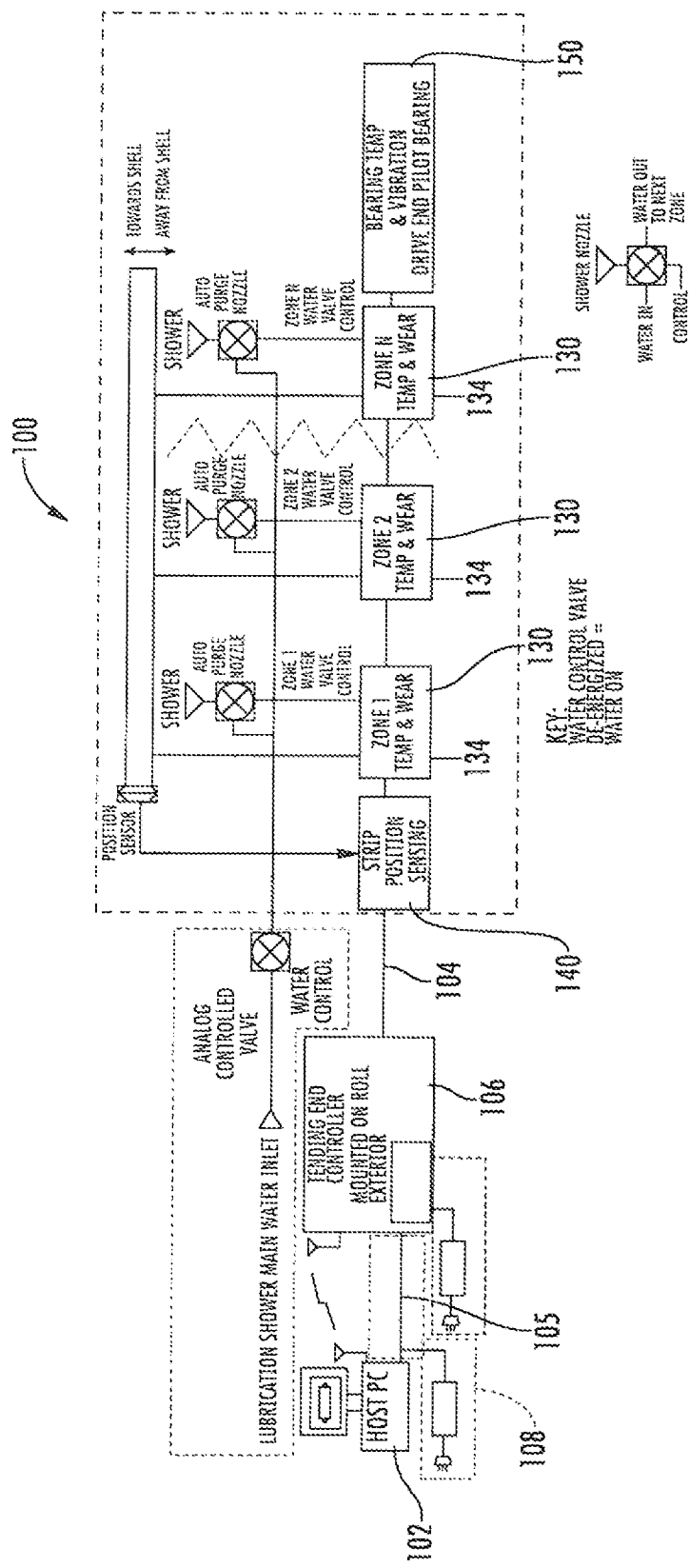
FIG. 5 is a schematic diagram of a suction roll seal strip sensing system according to embodiments of the invention.

Hardware of the System;

Host PC and Interconnection:

Referring to FIG. 5, the system host PC 102 comprises a conventional or industrial grade personal computer that is equipped with hardware that allows a connection to the user's network along with custom hardware that can connect to an independent data bus 105 (described in the art as RS-422 and/or RS-485 networks). This dedicated RS-422 or 485 network is used to connect to the Tending End Controller 106 (described below) mounted on or near the stationary suction box 20 on the suction roll housing. The connection from the Host PC 102 to the Tending End Controller 106 may be on a dedicated wired or wireless link 105.

It will also be understood that although the terms "first" and "second" may be used herein to describe various elements, these elements should not be limited by these terms. These terms are only used to distinguish one element from another element. Thus, a first element could be termed a second element, and similarly, a second element may be termed a first element without departing from the teachings of the present inventive concepts.

Example embodiments of the present inventive concepts may be embodied as nodes, devices, apparatuses, and methods. Accordingly, example embodiments of the present inventive concepts may be embodied in hardware and/or in software (including firmware, resident software, microcode, etc.). Furthermore, example embodiments of the present inventive concepts may take the form of a computer program product comprising a non-transitory computer-usable or computer-readable storage medium having computer-usable or computer-readable program code embodied in the medium for use by or in connection with an instruction execution system. In the context of this document, a computer-usable or computer-readable medium may be any medium that can contain, store, communicate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, or device. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Example embodiments of the present inventive concepts are described herein with reference to flowchart and/or block diagram illustrations. It will be understood that each block of the flowchart and/or block diagram illustrations, and combinations of blocks in the flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create means and/or circuits for implementing the functions specified in the flowchart and/or block diagram block or blocks.

These computer program instructions may also be stared in a computer usable or computer-readable memory that may direct a computer or other programmable data processing apparatus to function in a particular manner, such that the instructions stored in the computer usable or computer-readable memory produce an article of manufacture including instructions that implement the functions specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

Figure 7B:
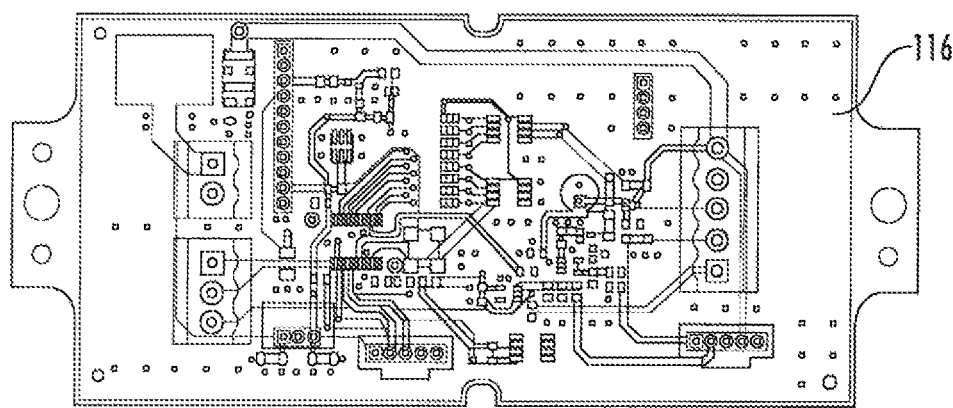
FIG. 7B is top view of the PCB of the Tending End Controller of FIG. 7A.

Tending End Controller:

Still referring to FIG. 5, the Tending End Controller 106 (also known as the Main Control Module, or MCM) may have several functions:

- Interfaces to the Host PC 102 via a dedicated RS-422/485 or wireless link 105. This link provides a pathway for commands and data to all of the interconnected modules on the system 100
- Communicates to and controls the data traffic to and from the various Zone modules (described below) mounted inside the suction box vacuum zone 30 on a separate dedicated RS-485 link 108
- Provides a pass-through connection for DC power to ail of the zone modules
- Provides an analog control (0-100% flow) signal to drive the main lubrication water inlet and by a feedback control signal monitors the valve position
- Measures and reports the outside of the suction roll temperature The MCM 106 (shown in FIGS. 6, 7A and 7B) receives power from an external +24V DC power supply 108. The MCM 106 also has the electronics hardware to drive the electronically controlled water valve for those systems that require it. The MCM 106 is connected to the host data collection PC 102 either by a separate wired RS-485 data bus 105 or by a dedicated secure wireless connection. FIG. 6 shows the MC M 106 wired to sensor modules. FIG. 7A shows a close-up of the MCM 106 with the radio data link module installed. Starting at the top left in FIG. 7A, the +24V power supply 108 is connected to the two terminal strip 112. The RS-485 link to the host PC 102 would be wired to the bottom left if the radio data link is not used. The data bus and power are fed to the ZTM modules via the 5 terminal strip 114 on the right of FIG. 7A. FIG. 7B is a diagram of the circuit board of the MCM 106.

Figure 8:
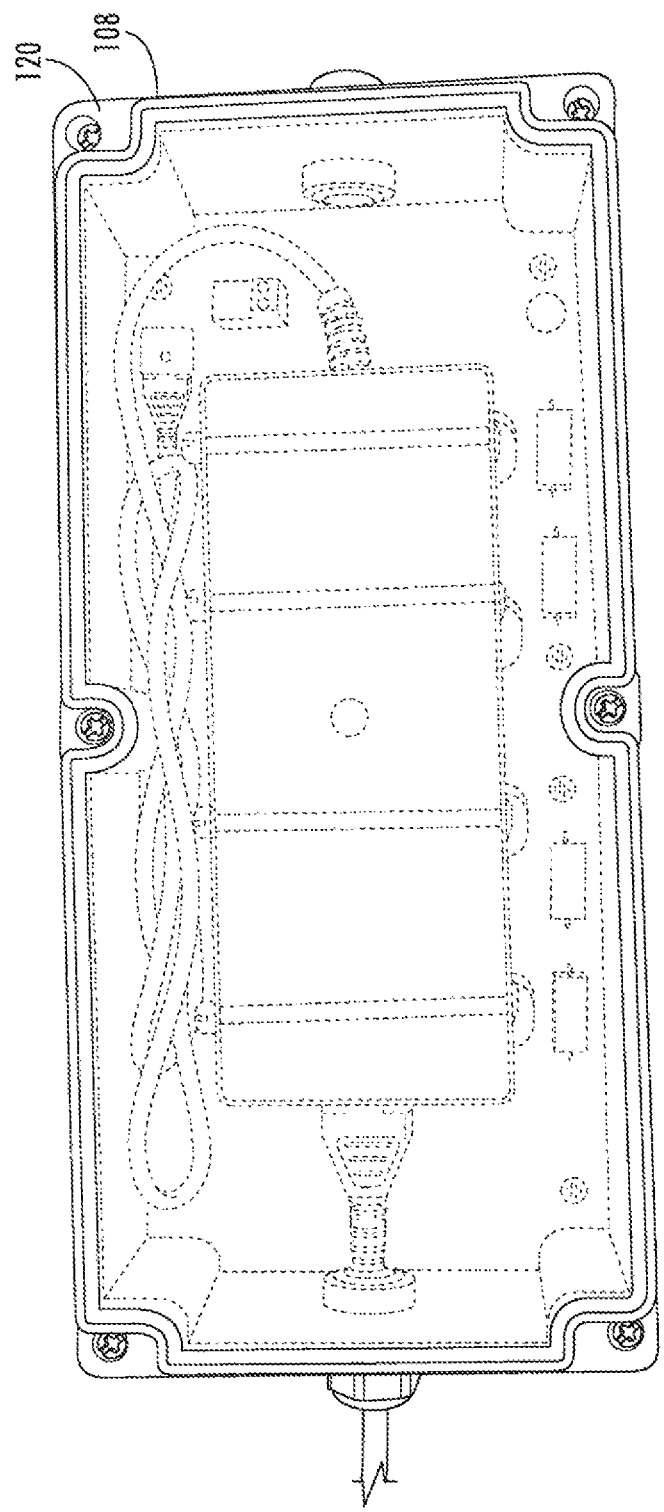
FIG. 8 is a top view of the power unit that drives the Tending End Controller of FIG. 6.

Referring now to FIG. 8, the system power supply module 108 may be a commercial off the shelf (COTS) 90-240 VAC 25-60 Hz VAC mains powered input (standard worldwide AC power input) +424 VDC @9 output module mounted on a custom designed PCB 120. The PCB 120 has load resistors to stabilize the output under low load and a blue LED to Indicate power status. This supply 108 has enough power to power 32 ZTM's (discussed below) and the associated MC M106 and the control valves as well, it is contained within a water tight polycarbonate enclosure.

Zone Modules:

Referring back to FIG. 5, there are several types of zone modules that can be used by the system 100. Some may be optionally fitted depending on user requirements. A typical system 100 may optionally include 32 Zone Temperature and Wear Modules 130 (8 per seal strip, 4 strips per suction roll), 4 Strip Position Sensor Modules 140, (1 per strip) and 1 Pilot Bearing Temperature and Vibration Zone Module 150 (1 per roll)

Zone Temperature and Wear Module

Figure 9:
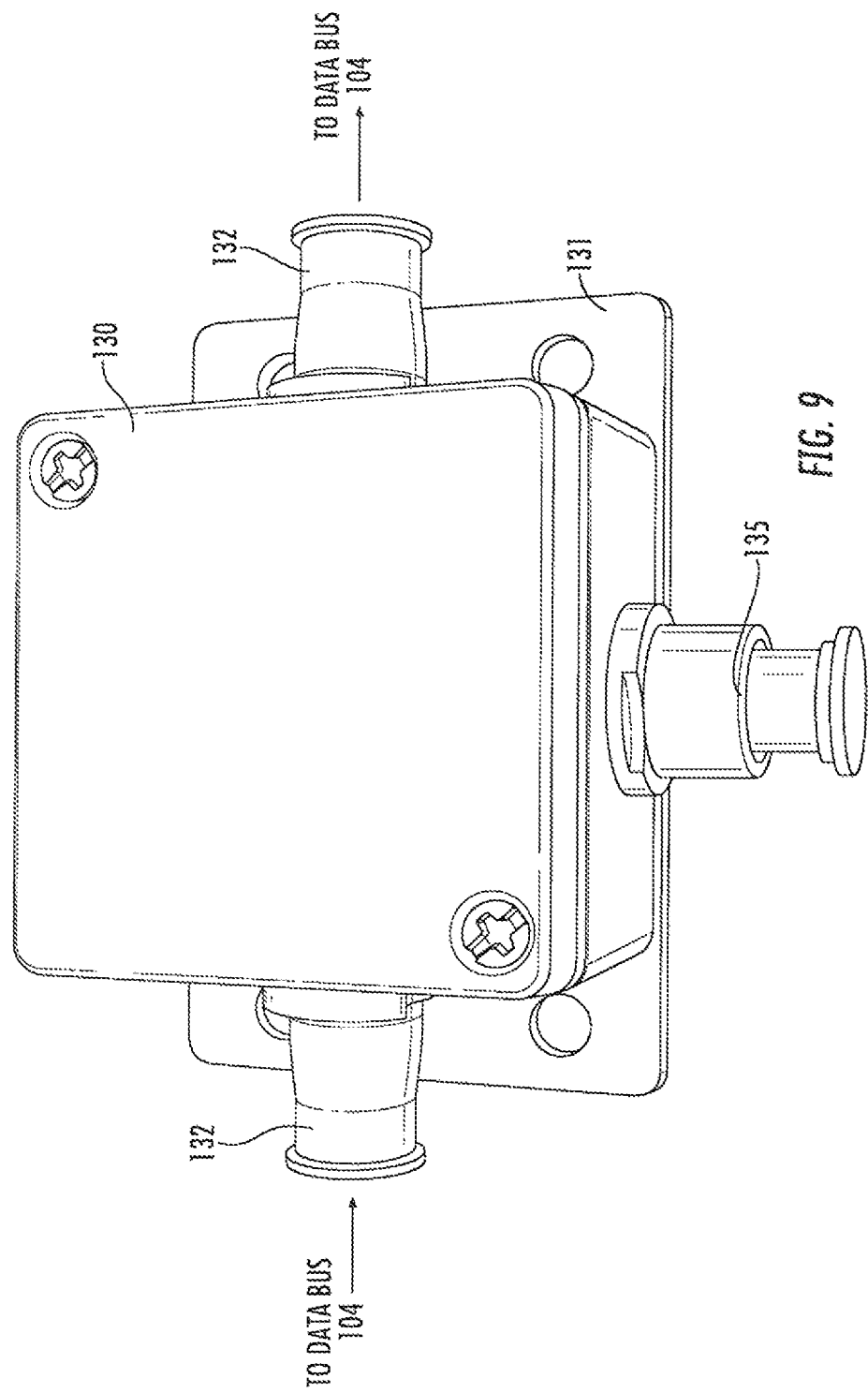
FIG. 9 is a perspective view of a Zone Temperature and Wear Module of the system of FIG. 5.

The Zone Temperature and Wear Module 130 (ZTM) is the most basic module. The functions of this module 130 may include:

- Measures the temperature from four digital temperature integrated circuits that are connected to the module from a single seal strip temperature module. (A more detailed description of the sensor used herein will be described in the section to follow)
- Can control as an option a water valve dedicated to each zone
- Can indicate wear in three levels (description to follow below)
- Communicates its measurement data to the Tending End Controller 106 and receives commands from the Tending End Controller 106
- Receives DC power from the tending end controller 106 and passes power to the next module FIG. 9 shows a ZTM 130 mounted to a mounting plate 131. The enclosure for the module is approximately 2 inches square and not quite as tall. The RS-485 data bus 104 and the power are connected to two male connectors 132 on, opposite sides of the module 130 so the data and power pass through these connectors 132 to the next module on the bus. The first module on the bus connects to the MCM 106, which provides the starting point for both the data bus and the power feed. The temperature/wear sensor 134 connects to the female connector on the lower edge of the module 130.

Figure 10:
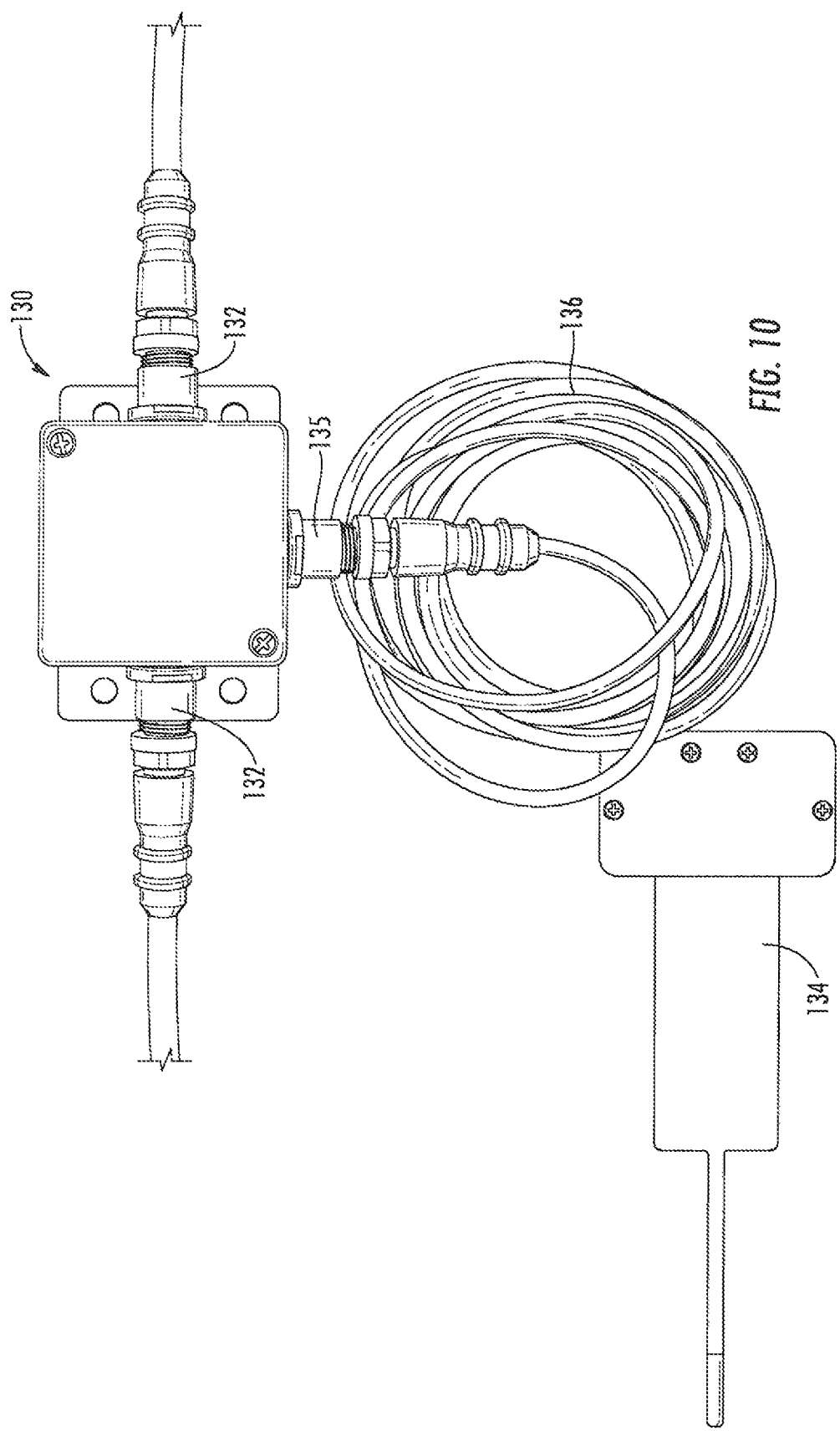
FIG. 10 is a top view of the Zone Temperature and Wear Module of FIG. 9 with a sensor unit.

FIG. 10 shows an example of the bus cable input and output and also the connection of the flex PCB temperature sensor 134 (described in more detail, below). The illustrated cable 136 is 2 meters long in the illustrated embodiment but could be any required length just as the data cables.

Figure 11:
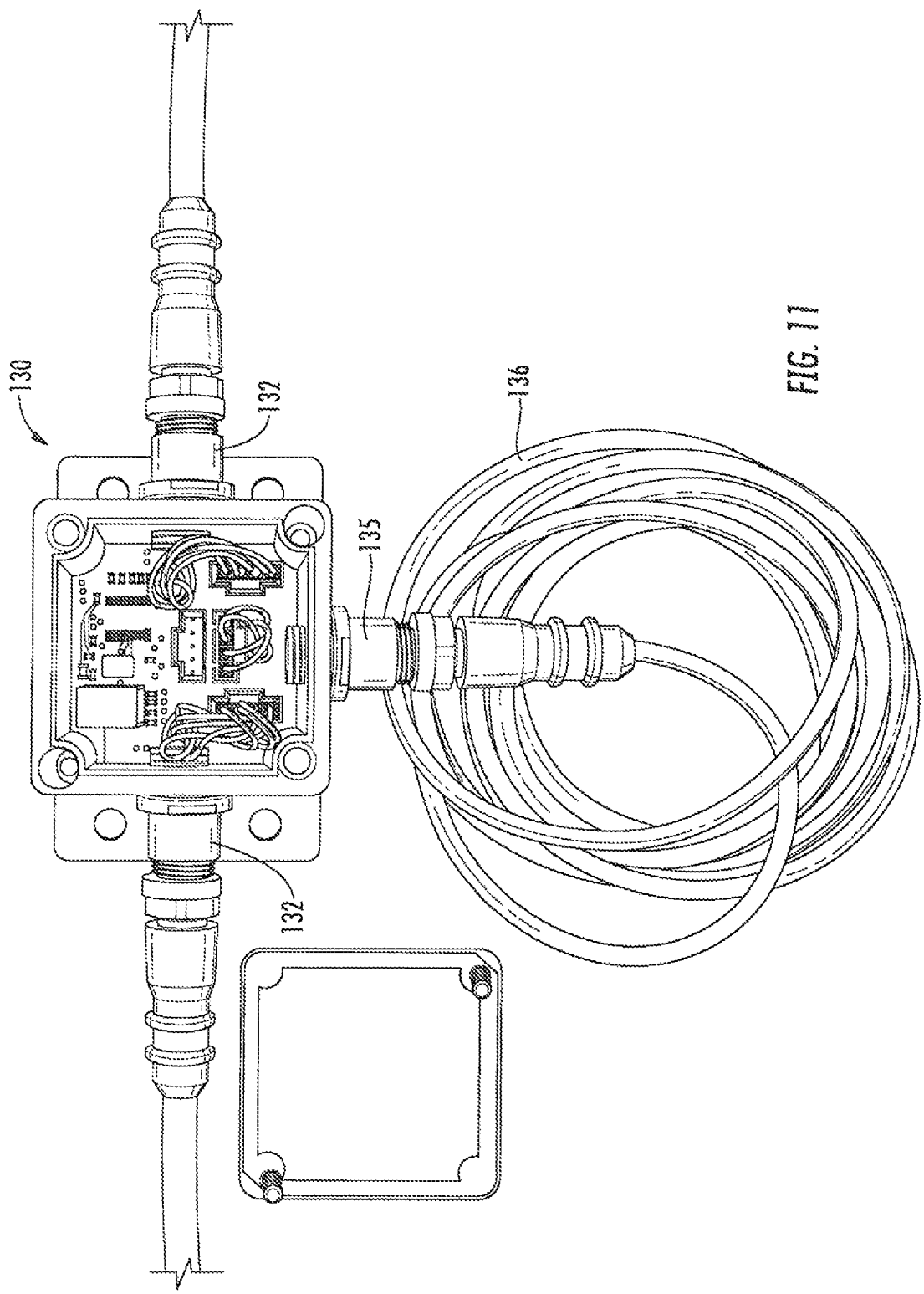
FIG. 11 is a top view of the Zone Temperature and Wear Module of FIG. 9 with the cover removed.

FIG. 11 shows the ZTM 130 with the lid removed exposing the electronics and cable connections. In production the cavity in the housing may be filled with Dow Corning Sylgard® or similar encapsulating material to make the unit waterproof. This adds additional protection in addition to the cover gasket. All cables connector boots may be over-molded and watertight.

Figure 12:
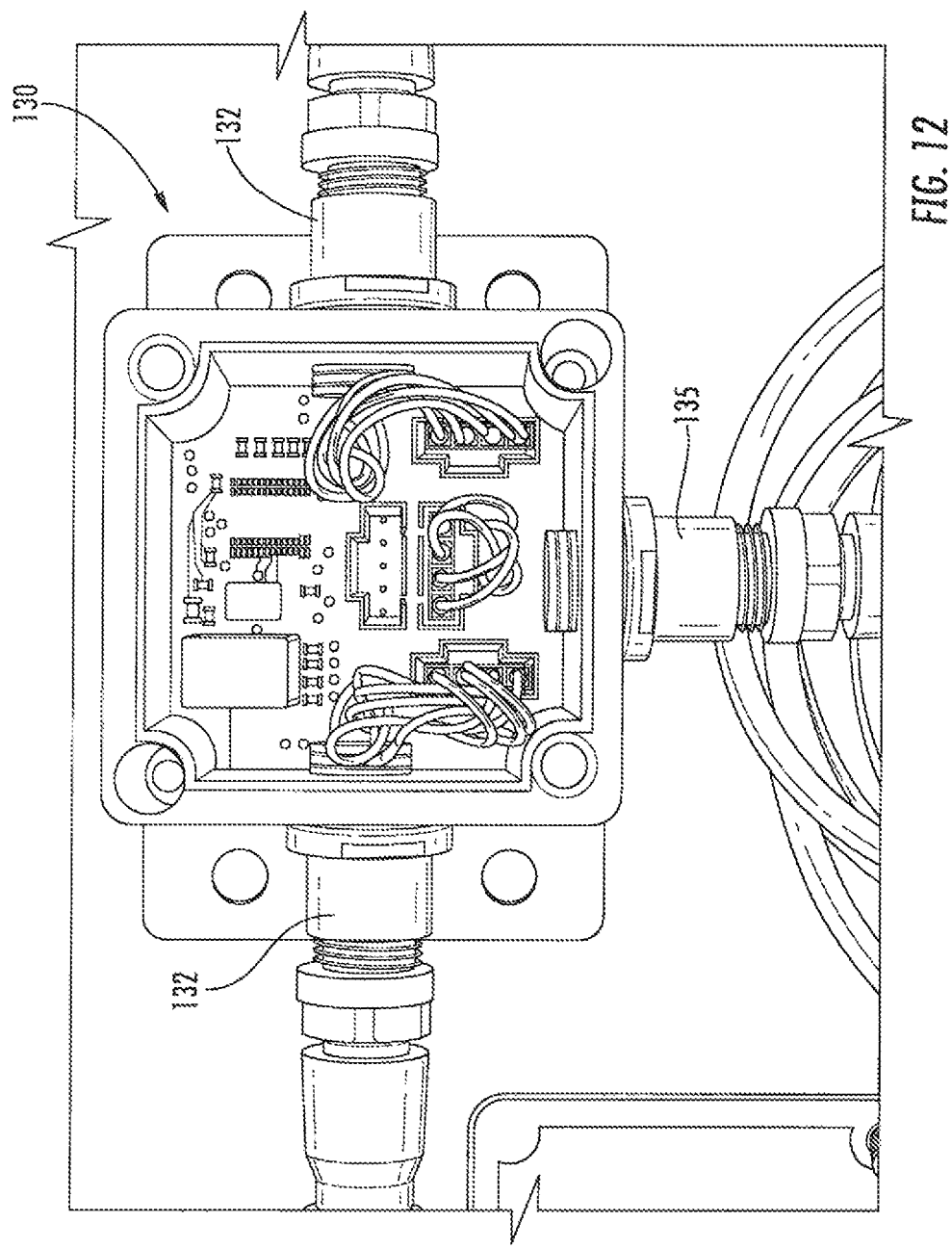
FIG. 12 is an enlarged view of the Zone Temperature and Wear Module of FIG. 11.
Figure 13:
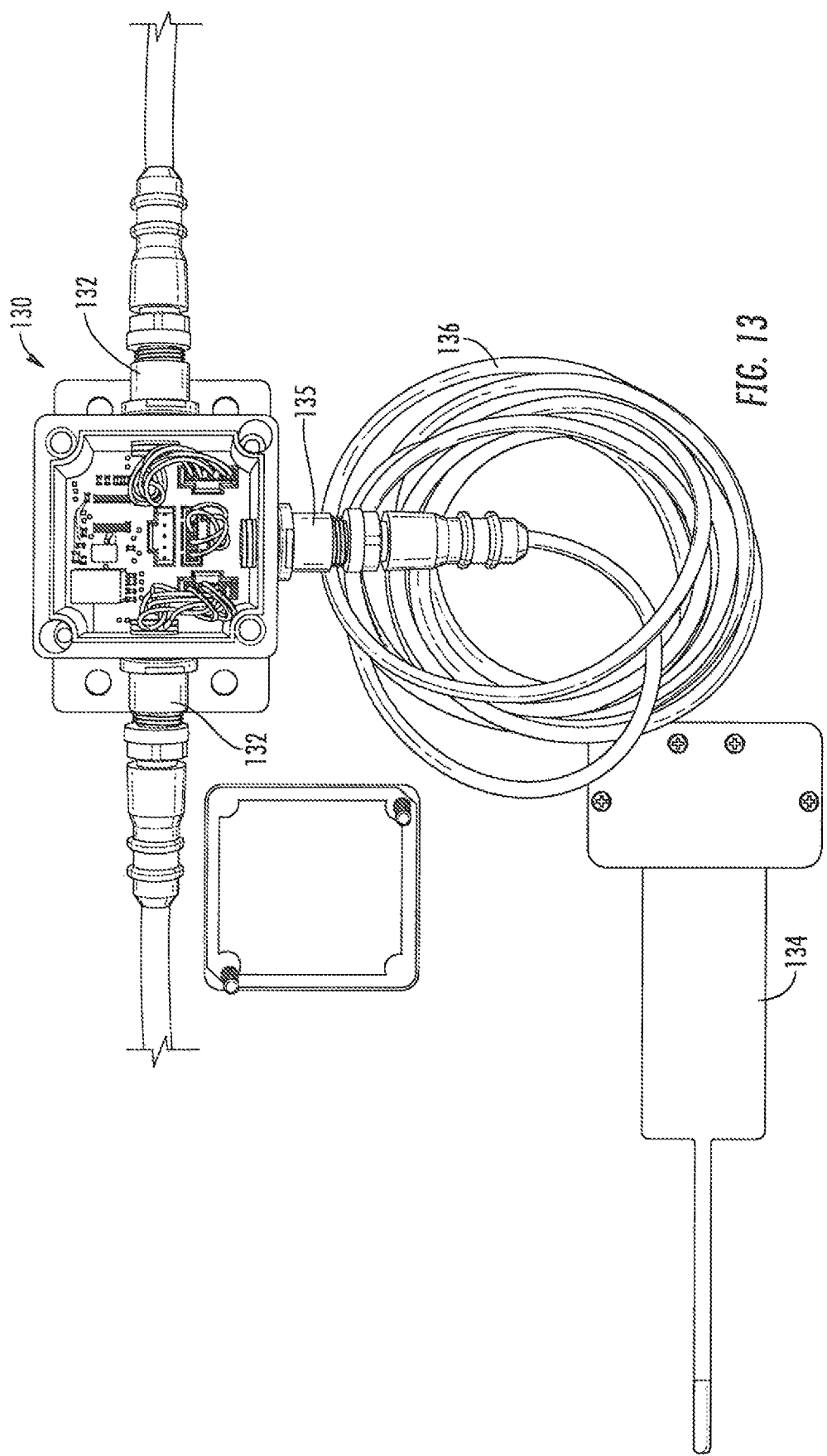
FIG. 13 is a top view of the Zone Temperature and Wear Module of FIG. 9 with a sensor unit and with, the cover removed.

FIG. 12 is a close-up photo of the ZTM 130 with the cover removed. FIG. 13 is a close-up photo of the system interconnect with the ZTM cover removed.

Figure 14:
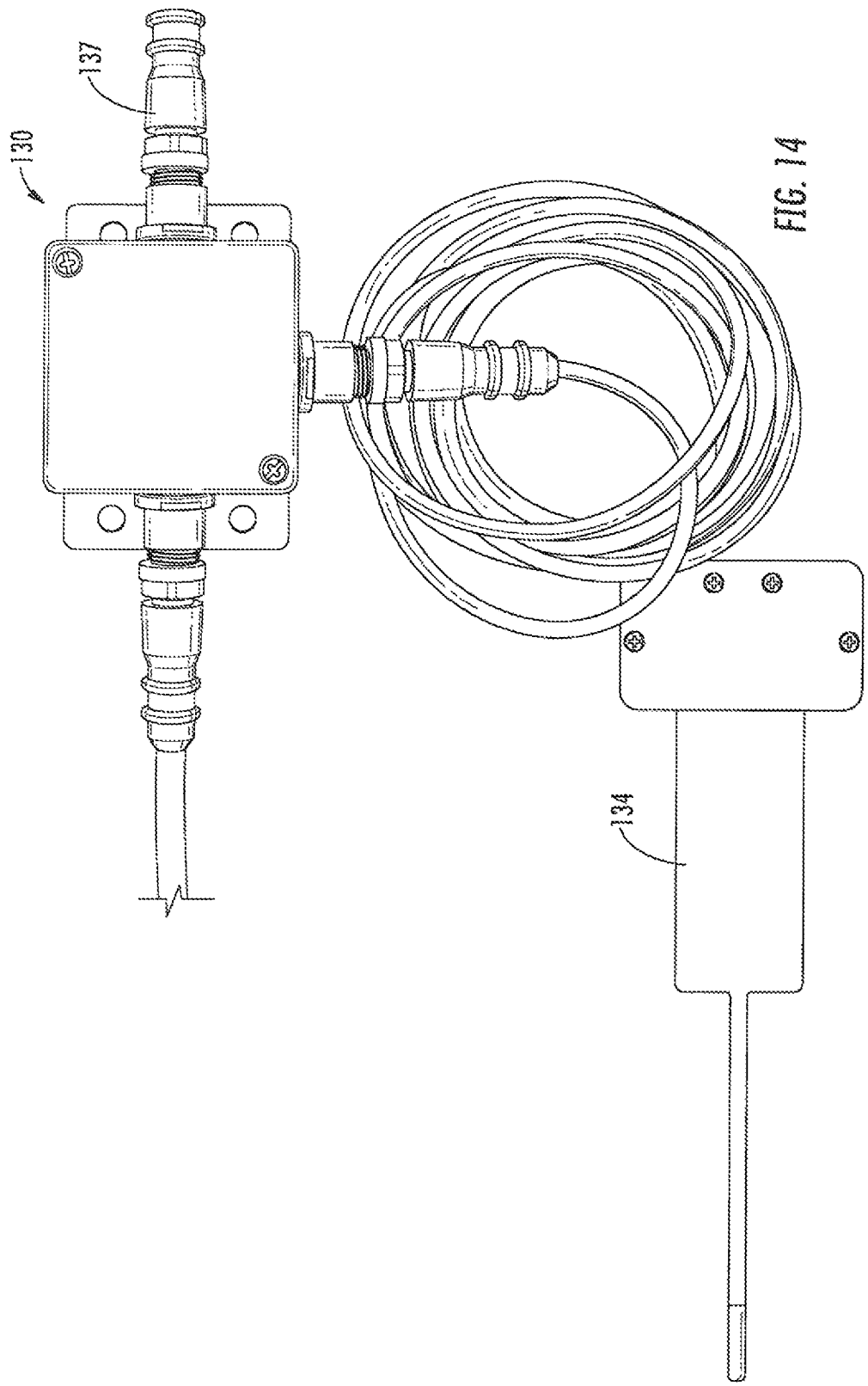
FIG. 14 is a top view of the Zone Temperature and Wear Module of FIG. 9 with a sensor unit with the cover in place.
Figure 15:
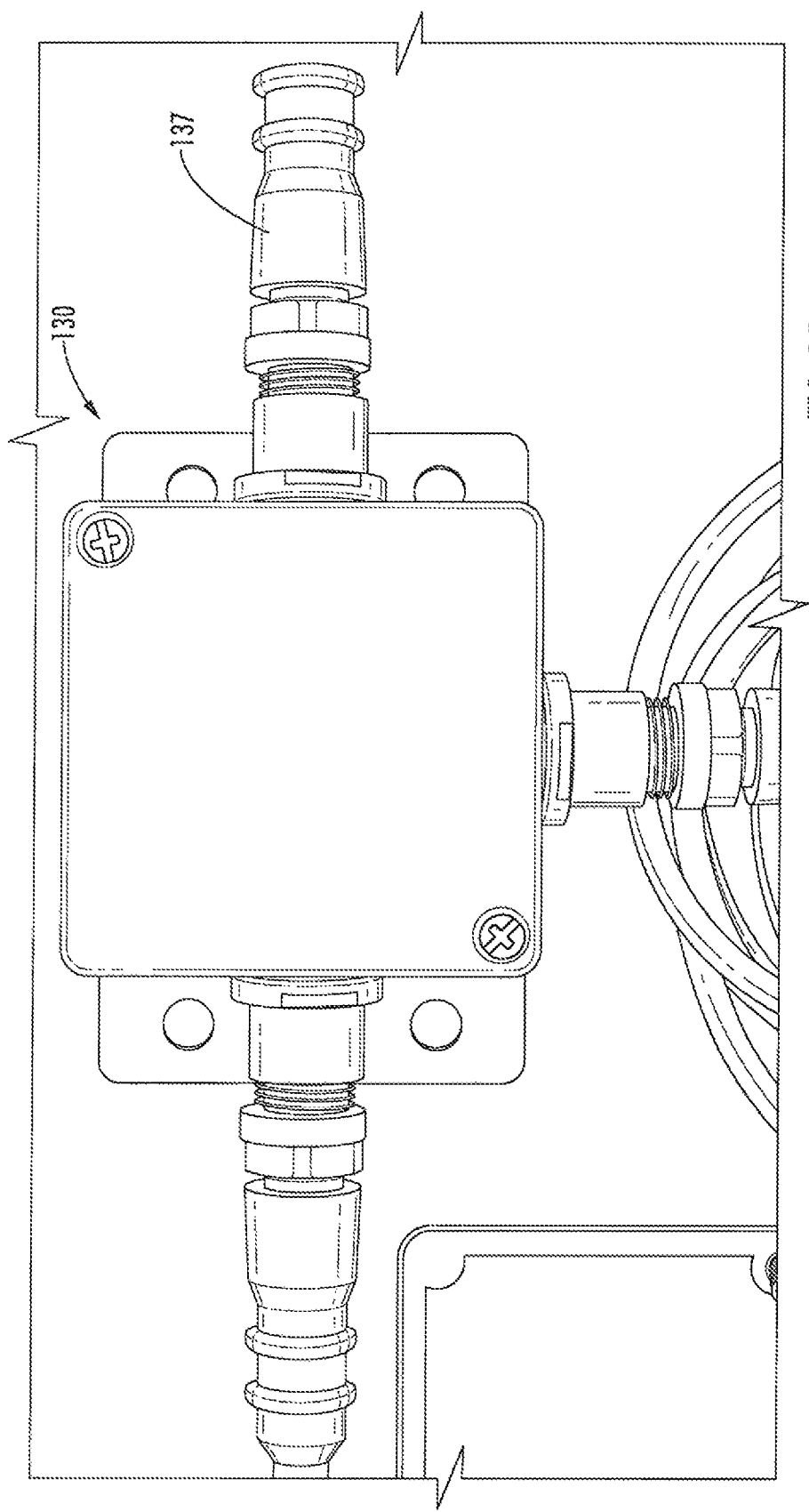
FIG. 15 is an enlarged view of the Zone Temperature and Wear Module of FIG. 9.

The last ZTM 130 on the bus has a passive termination resistor plug 137 to properly electrically terminate the bus 104 in its characteristic impedance to eliminate electrical reflections on the bus that would cause data errors. FIG. 14 shows a depiction of the last ZTM 130 with the termination connected. The data bus entering from the left is the cable from the previous module 130. FIG. 15 shows a close up of the termination connected to the ZTM 130.

The devices shown in FIGS. 9-15 are contained within the suction box area 30. Externally the data bus 104 and power unit 108 are connected to the MCM 106, which is a larger box that provides the data bus 104 and power feed point to the ZTMs 130 and other RS-485 connected modules on the data bus 104.

Strip Position Sensor Module

Figure 3:
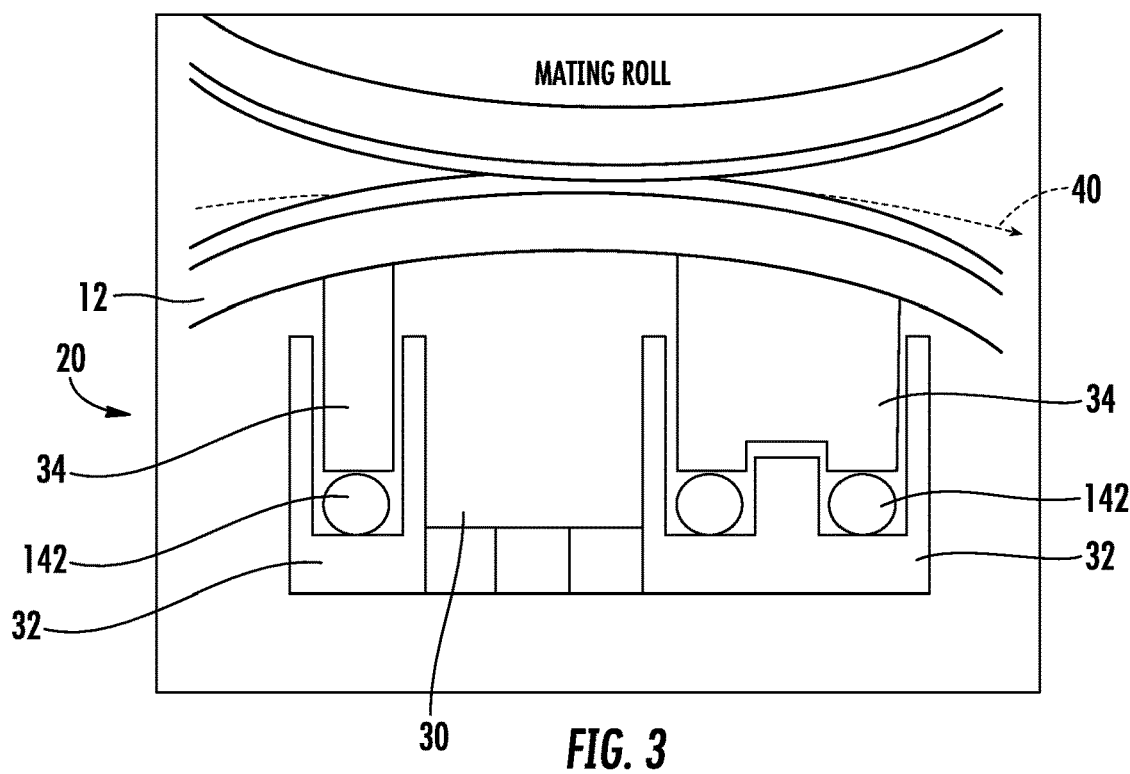
FIG. 3 is an end view of the suction box area and seal strips of a conventional suction roll.
Figure 4:
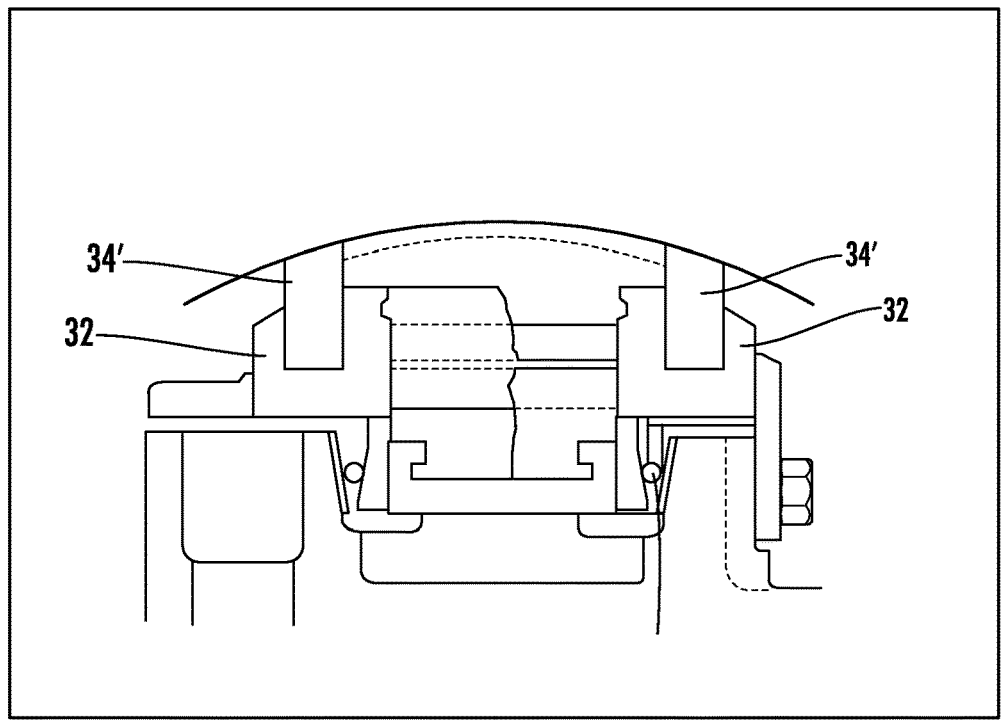
FIG. 4 is an end view of the suction box area and seal strips of another conventional suction roll.

The Strip Position Sensor Module 140 is an optional module that measures the physical movement of the seal strips 34 in fractions of an inch or mm by measuring the physical movement of the seal strip 34 in reference to the stationary holder 32 in which the seal strip 34 is held. This position is commonly controlled by the amount of pressure contained within a "load tube" 142 (a hose that runs underneath the entire length of the seal strip 34), which has pressure supplied at the one end and is sealed with a cap at the far end (see FIG. 3). Pressure in the load tube 142 expands the load tube 142 (much like air in a balloon) and lifts the seal strip 34 toward the inside surface of the shell 12. This effect along with help from the system vacuum from the suction box 20 and the laminar flow of lubrication water mentioned previously forms the seal between the edge of the seal strip 34 and the inside of the shell 12. Pulling too much vacuum on the shell 12 through the suction box 20 will affect the seal strip to shell seal. Excess vacuum as well as inadequate lubrication shower water flow can vastly affect the service life of the seal, causing premature wear or total seal failure. The position sensor module 140 can be used to keep tabs on strip movement. Like the other modules the measurement data is communicated to the tending end controller 106 on the RS-485 data bus 104.

Pilot Bearing Temperature and Vibration Sensor Module

Referring again to FIG. 5, a Pilot Bearing Temperature and Vibrations Sensor Module 150 uses a digital temperature measurement integrated circuit to measure the relative bearing temperature with an external sensor and the vibration using an external piezo- or MEMS-based accelerometer. The data from these measurements is sent on request to the Tending End Controller 106.

Seal Strip Temperature/Wear Sensor

Figure 16:
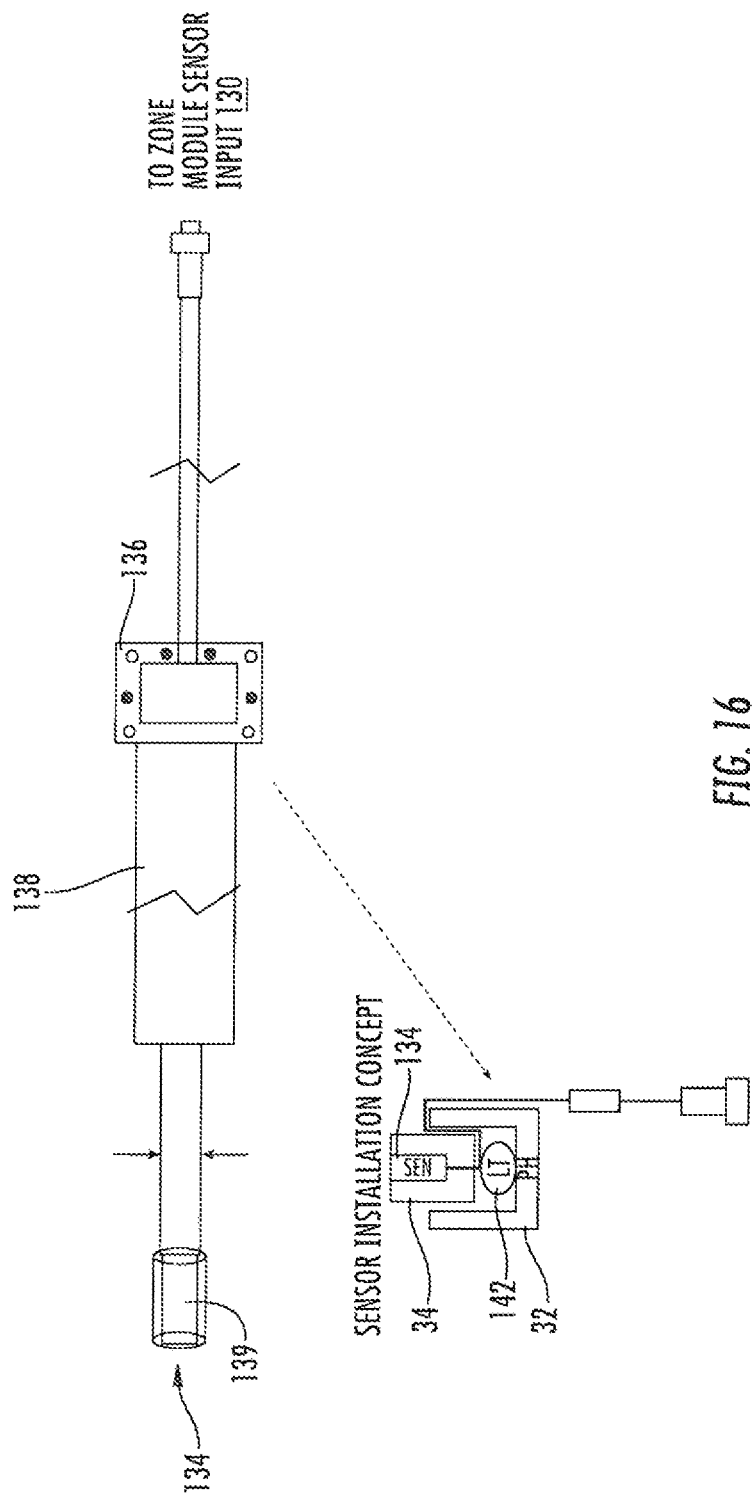
FIG. 16 is a schematic diagram of the sensor unit of a Zone Temperature and Wear Module of FIG. 9.
Figure 17:
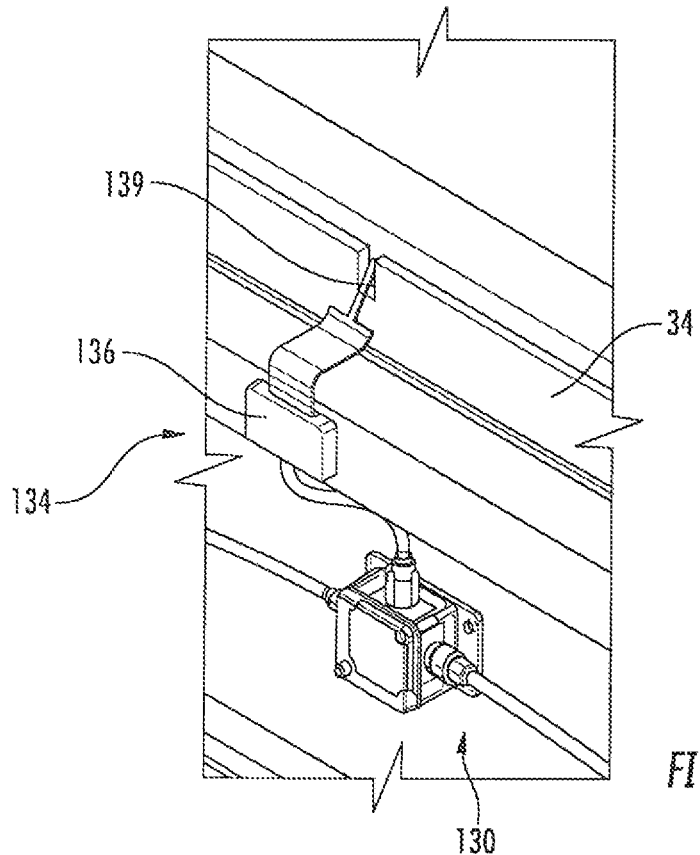
FIG. 17 is a perspective view of the Zone Temperature and Wear Module of FIG. 16 in place on a seal strip.
Figure 18:
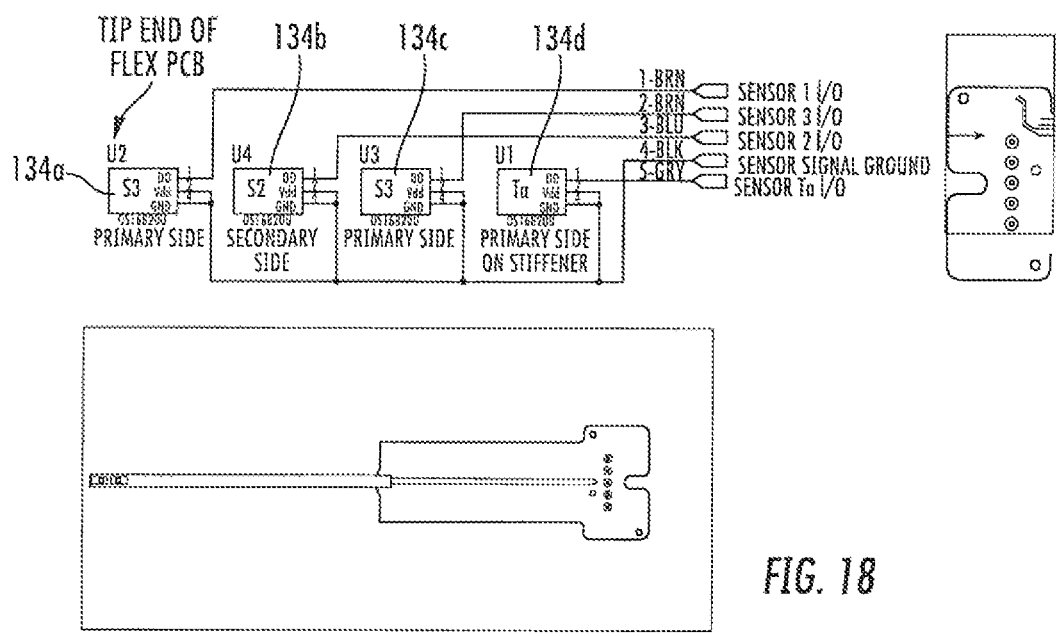
FIG. 18 is a schematic diagram of a sensor unit of the Zone Temperature and Wear Module of FIG. 16.

Referring now to FIGS. 16-18, the Seal Strip Sensor 134 comprises four digital temperature sensors 134a, 134b, 134c, 134d, three of which (134a-c) are mounted on the flex end of a ridged/flex Kapton® (polyimide film) PCB 138 and sealed inside of an epoxy shell 139.

These three sensors 134a-c are spaced at three, different intervals from the sensor end so to indicate three different levels of sensor wear. The sensors 134a-c are arranged so that when wear occurs the temperature sensor is electrically disconnected and the temperature data can no longer be read. In the illustrated embodiment, the point of wear starts at approximately ⅛" for the sensor 134a closest to the end, at 1¼" for the middle sensor 134b and ⅜" for the last sensor 134c. It should be noted that connecting these sensors to their own dedicated microprocessor pin isolates them so that, when the electrical circuit is broken due to wear, the electrical grounding to the suction roll shell 12 will not affect the remaining good (not worn) sensors.

In addition to the three seal mounted sensors 134c, the fourth sensor 134d is mounted on the ridged section of the PCB 138 and is contained and sealed against water intrusion, with a clamshell enclosure 136. This temperature sensor 134d measures the ambient temperature inside the suction box 20 and is used as a reference temperature.

A 1 meter round cable exits the clamshell 136 and connects to the input of the zone temperature module 130.

Figure 19:
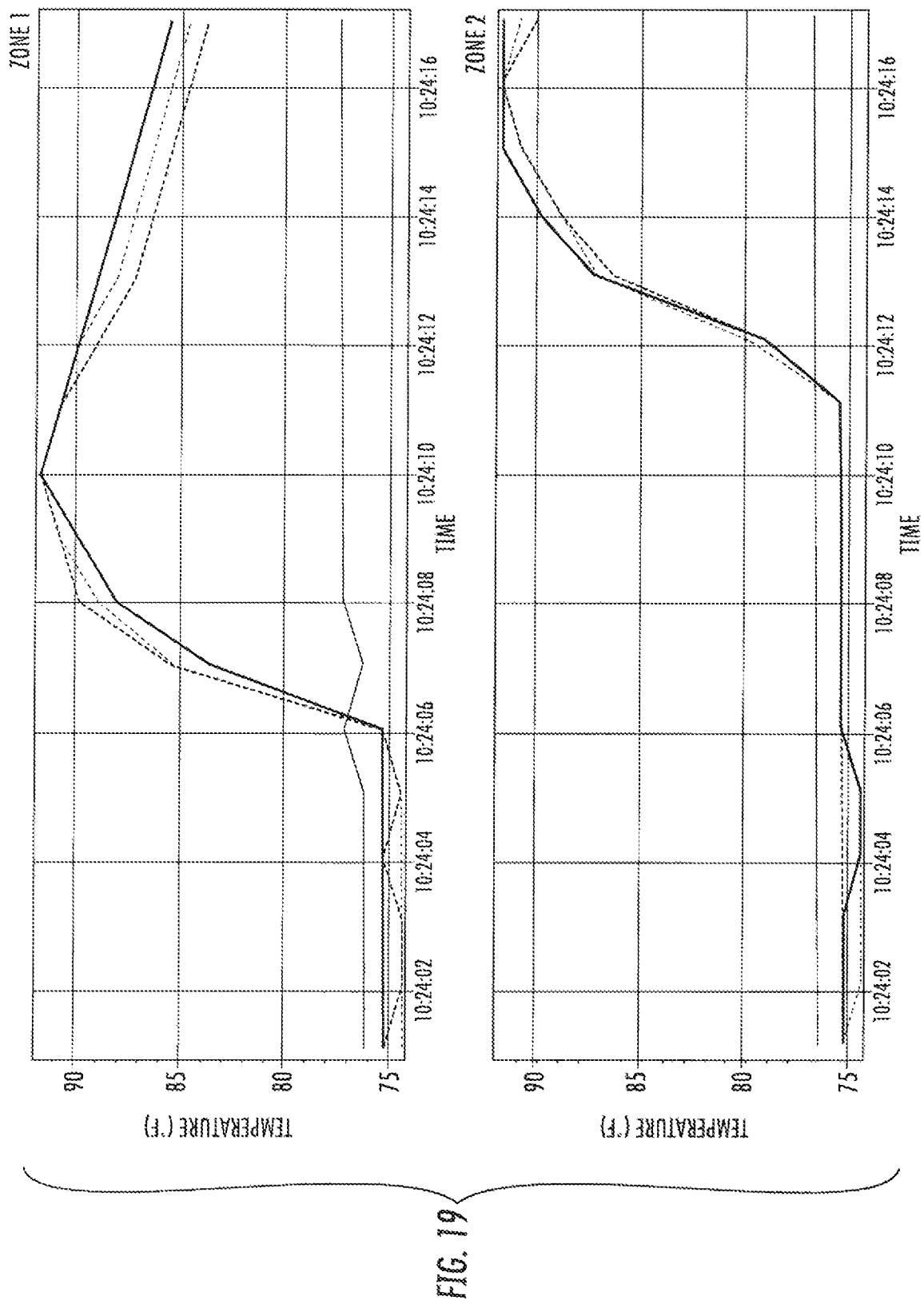
FIG. 19 depicts two exemplary plots of temperature as a function of time for two different zones of a suction roll.

FIG. 19 shows an example of dynamically reading the status of two sensors through the entire system. The response of the three sensors intended to be embedded in the seal strip and the ambient sensor are shown. Each square along the X axis represents two seconds of time, so it is evident that the sensors react to temperature changes quite rapidly. The Zone Status on the left shows the peak temperature and the green bar indicates that the temperature is valid (not broken due to wear). The display can show up to 32 zones at once.

Other types of sensors could be employed, including thermocouples, thermistors, and the like.

It should be noted that the sensors 134a-134c used to monitor seal strip temperature/wear are mounted in a non-conventional manner. That is, they are mounted so that two sensors 134a, 134c are on the top side of the flex PCB 138 and one sensor 134b is on the bottom side. This arrangement helps to position the sensors closer together to make more precise wear measurements.

Once the PCB 138 is assembled, it may be coated with a polyurethane coating to add chemical resistance. The tip end (the end that ultimately is inserted and epoxied into place in the target seal strip 34) may be inserted into the epoxy shell 139 and potted in high temperature epoxy.

Added Optional Features and Enhancements:

Main Versus Zone Water Control

Since the system collects temperature data it is easy to act upon that data based on seal strip operating parameters by controlling the flow of water to the lubrication showers at the main water entry point to the suction roll or with individual zone valves. In one embodiment of the system, the zone water control valves are eliminated to conserve system cost and one main valve is used to control the flow of water to the entire roll. The Tending End Controller 106 acting on data collected by all of the bus-connected zone temperature modules sends an analog signal in the range of 1 to 10 volts (corresponding to 0 to 100% of valve opening) to the valve. The valve provides a feedback signal of 1 to 10 volts that indicates the valves current position (again 1V=0% and 10 Volts=100%) a relative indication of water flow.

In a similar fashion, if true zone water control is implemented, an individual zone valve is controlled and its position is confirmed by each individual zone temperature module using the local sensor data collected by the embedded sensors.

Auto-Purge System

Shower nozzles used in systems that have an auto-purge system have an internal mechanism that uses a diaphragm and a wire that cleans the nozzle whenever the pressure drops to 10 psi or below. To implement this in the system 100 described above, either the main valve would be closed periodically (e.g., for 10 seconds once an hour), or in the case of true zone water control, the zone module would control the valve. This purging could be programmed by the host PC 102 to send a command to the Tending End Controller 106. The Tending End Controller 106 would cycle the main valve closed, then open to execute a purge cycle or, in the case of zone module control, would command each zone in turn to perform the purge function. Doing the zone purge in turn (i.e. one zone valve cycle at a time) instead of all at once may reduce the immediate power surge on the system power supply.

Pilot Bearing Temperature and Vibration Monitor Module

This module includes a microprocessor, a RS-485 data bus receiver/driver, and analog signal conditioning circuits. It reports the bearing temperature along with analog vibration data from the pilot bearing mount. Since this data may require a dedicated use of the data bus communications, all of the other modules may be suspended while vibration readings are being taken.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as recited in the claims. The invention is defined by the following claims, with equivalents of the claims to be included therein.

That which is claimed is:

1. A suction roll, comprising:
a cylindrical shell having an internal lumen and a plurality of through holes;
a suction box positioned in the lumen of the shell;
a suction source operatively connected with the suction box;
at least one seal strip attached to the suction box and configured to assist in forming a seal between the suction box and the shell;
first, second and third sensors attached to the seal strip and mounted on a printed circuit board, wherein the first and third sensors are mounted on one side of the printed circuit board and the second sensor is mounted on an opposite side of the printed circuit board; and
a controller operatively connected with the sensors;
wherein the sensors are configured to convey signals to the controller, the signals being processed in the controller to provide data on the seal strip on at least one of temperature, wear, vibration, and pressure.

2. The suction roll defined in claim 1, further comprising a lubrication shower positioned to lubricate the seal strip.

3. The suction roll defined in claim 2, wherein the controller is configured to regulate release of water from the lubrication shower based on data acquired by the sensor.

4. The suction roll defined in claim 2, wherein the controller is configured to activate the lubrication shower to purge itself based on data acquired by the sensor.

5. The suction roll defined in claim 1, wherein the sensors are configured to provide temperature data.

6. The suction roll defined in claim 1, wherein the first, second and third sensors are configured and arranged such that prolonged wear at one end thereof deactivates the sensor, thereby indicating that the seal strip has worn a predetermined amount.

7. A suction roll, comprising:
a cylindrical shell having an internal lumen and a plurality of through holes;
a suction box positioned in the lumen of the shell;
a suction source operatively connected with the suction box;
at least one seal strip attached to the suction box and configured to assist in forming a seal between the suction box and the shell;
first, second and third sensors attached to the seal strip, the sensors being mounted on a flexible circuit board, wherein the first and third sensors are mounted on one side of the printed circuit board and the second sensor is mounted on an opposite side of the printed circuit board; and
a controller operatively connected with the sensors;
wherein the sensors are configured to convey signals to the controller, the signals being processed in the controller to provide data on the seal strip on at least one of temperature, wear, vibration, and pressure.

* * * * *